(12) United States Patent
Yano

(10) Patent No.: US 12,394,480 B2
(45) Date of Patent: Aug. 19, 2025

(54) FLASH MEMORY

(71) Applicant: Winbond Electronics Corp., Taichung (TW)

(72) Inventor: Masaru Yano, Kanagawa (JP)

(73) Assignee: Winbond Electronics Corp., Taichung (TW)

( * ) Notice: Subject to any disclaimer, the term of this patent is extended or adjusted under 35 U.S.C. 154(b) by 220 days.

(21) Appl. No.: 18/321,791

(22) Filed: May 23, 2023

(65) Prior Publication Data

US 2023/0386574 A1    Nov. 30, 2023

(30) Foreign Application Priority Data

May 24, 2022    (JP) ................. 2022-084470

(51) Int. Cl.
| | | |
|---|---|---|
| G11C 16/04 | (2006.01) | |
| G11C 16/10 | (2006.01) | |
| G11C 16/14 | (2006.01) | |

(52) U.S. Cl.
CPC ........ G11C 16/0433 (2013.01); G11C 16/102 (2013.01); G11C 16/14 (2013.01)

(58) Field of Classification Search
CPC ... G11C 16/0433; G11C 16/102; G11C 16/14; G11C 16/0466; G11C 16/10; G11C 16/0483; G11C 16/34; G11C 16/24; H10B 43/30; H10B 41/20; H10B 41/40; H10B 43/20; H10B 43/40
USPC .................................................. 365/189.011
See application file for complete search history.

(56) References Cited

U.S. PATENT DOCUMENTS

| | | | |
|---|---|---|---|
| 6,570,788 B1 * | 5/2003 | Nakamura | H10B 43/30 |
| | | | 365/185.27 |
| 7,973,355 B2 | 7/2011 | Baik et al. | |
| 2004/0251488 A1 | 12/2004 | Fujiwara et al. | |
| 2009/0315099 A1 | 12/2009 | Park et al. | |
| 2014/0226415 A1 * | 8/2014 | Toyama | G11C 16/16 |
| | | | 365/185.27 |

FOREIGN PATENT DOCUMENTS

| | | |
|---|---|---|
| CN | 105659369 | 10/2019 |
| EP | 1936672 | 6/2008 |
| JP | 2001101880 | 4/2001 |
| JP | 2001102553 | 4/2001 |
| TW | 201114022 | 4/2011 |

OTHER PUBLICATIONS

"Office Action of Taiwan Counterpart Application", issued on Feb. 20, 2024, p. 1-p. 8.
"Office Action of Japan Counterpart Application", issued on Mar. 14, 2023, p. 1-p. 6.

* cited by examiner

Primary Examiner — Alexander Sofocleous
Assistant Examiner — James S Wells
(74) Attorney, Agent, or Firm — JCIPRNET

(57) ABSTRACT

A flash memory capable of achieving high integration and low power consumption is formed by an AND-type memory cell array, an address buffer, a row selecting/driving circuit, a column selecting circuit, an input and output circuit, and a read/write control part. A memory cell includes, for example, a charge storage layer of an ONO structure. The read/write control part performs programming and erasing by Fowler-Nordheim (FN) tunneling between the charge storage layer and a channel of a selected memory cell.

14 Claims, 6 Drawing Sheets

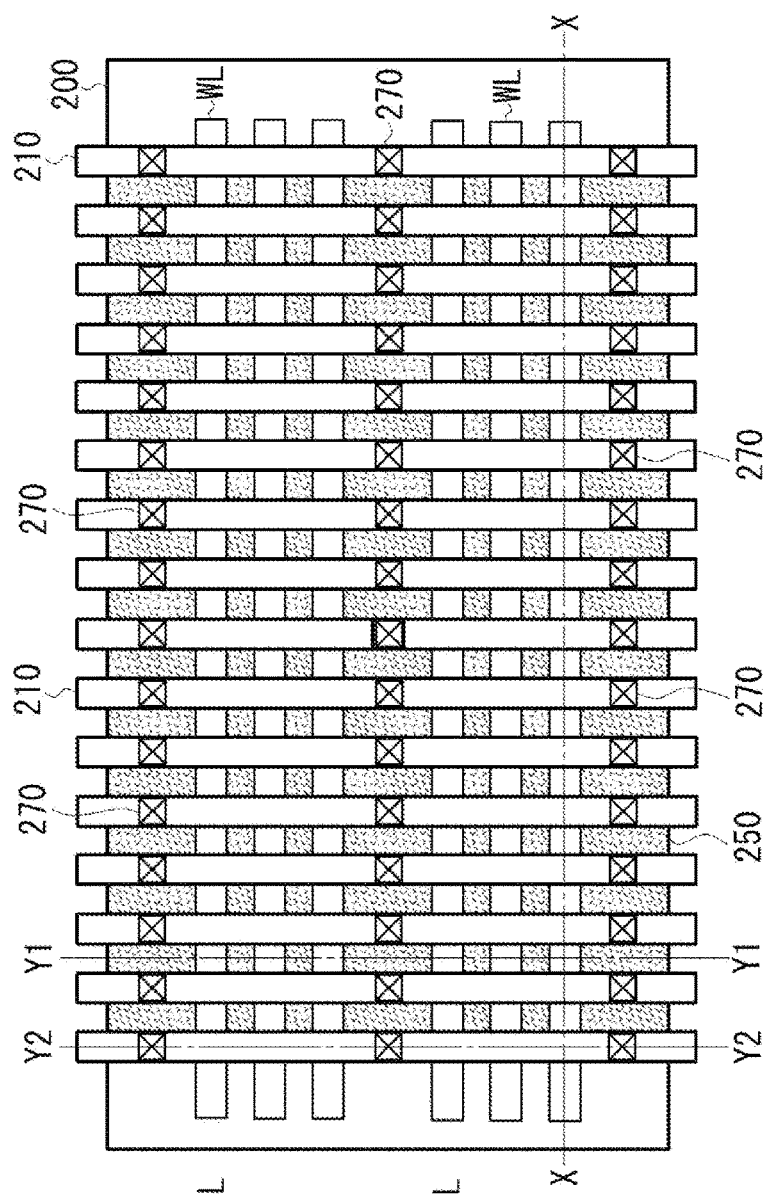

Enlarged view of part A

Enlarged view of part B

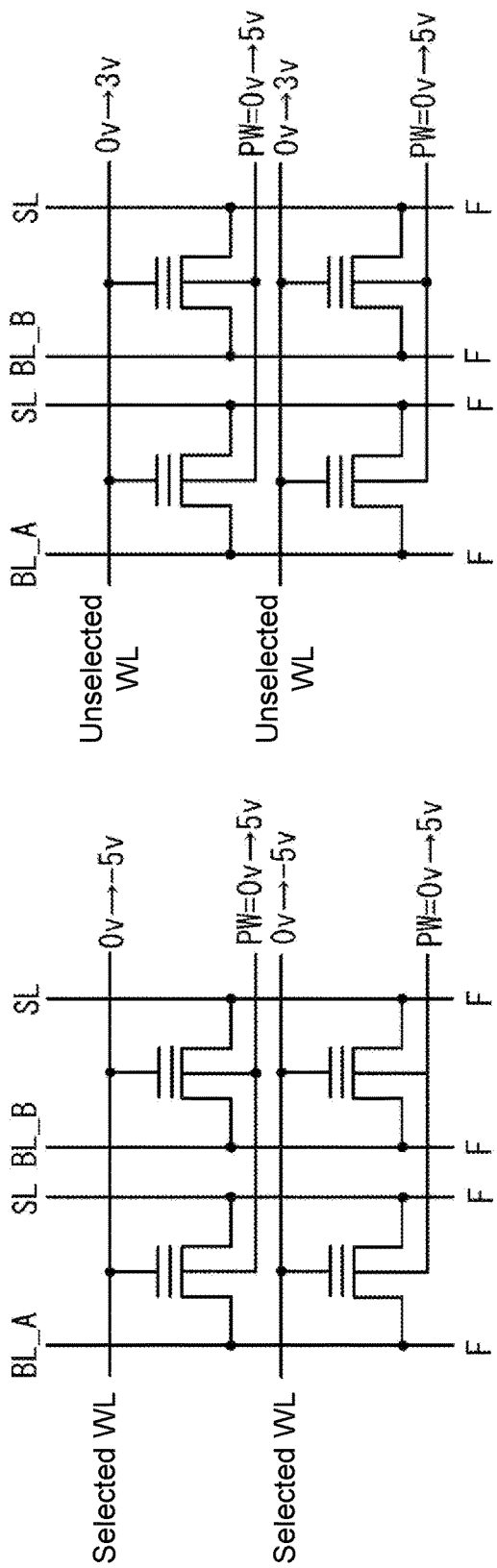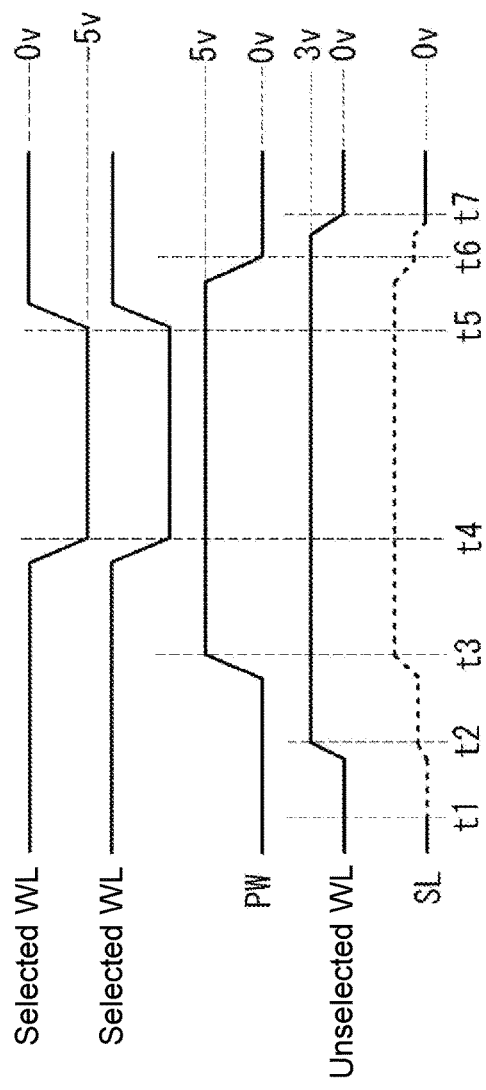
FIG. 7A
FIG. 7B
FIG. 7C

FLASH MEMORY

CROSS-REFERENCE TO RELATED APPLICATION

This application claims the priority benefit of Japan application serial no. 2022-084470, filed on May 24, 2022. The entirety of the above-mentioned patent application is hereby incorporated by reference herein and made a part of this specification.

BACKGROUND

Technical Field

The disclosure relates to a flash memory with an AND-type memory cell array structure.

Description of Related Art

Negative OR (NOR)-type flash memory is a non-volatile memory in which a memory cell is arranged between a bit line and a source line, and the memory cell may be randomly accessed. In order to improve the integration of the NOR-type flash memory, a hypothetical grounding method or a multi-level method is adopted.

The NOR-type flash memory promotes high integration, but its scaling is gradually approaching the limit. In programming, a programming voltage is required to be applied to the selected memory cell, a positive voltage is required to be applied to the selected bit line, and 0 V is required to be applied to the selected source line, so that the charge of hot electrons generated by the channel current between the source and the drain is stored in the charge storage layer. However, if the gate length is reduced along with the scaling and a relatively large voltage (to 5 V) is applied to the bit line (drain), a punch-through problem may then occur between the source and the drain. Therefore, the scaling of NOR-type memory cells is limited. Further, a NOR-type memory cell causes a channel current to flow through during programming, and power consumption increases as a result.

SUMMARY

The disclosure provides a flash memory including a memory cell array, a row selection mechanism, a column selection mechanism, and a control mechanism. The memory cell array includes a plurality of word lines extending in a row direction, a plurality of bit lines extending in a column direction, a plurality of source lines, and a plurality of memory cells. Each of the memory cells includes a charge storage layer, a gate formed on the charge storage layer, and a drain region and a source region connected to the bit line and the source line. The plurality of memory cells are connected in parallel between the bit lines and the source lines, and the gates of the memory cells in the row direction are connected to the corresponding word lines together. The row selection mechanism selects among the word lines in the row direction. The column selection mechanism selects among the bit lines and the source lines in the column direction. The control mechanism controls the reading, programming, or erasing of the memory cell selected by the row selection mechanism and the column selection mechanism. The programming or erasing is performed by tunneling of electrons between a channel and the charge storage layer of the selected memory cell.

To sum up, in the disclosure, the plurality of memory cells are connected in parallel between the bit lines and the source lines, and programming and erasing are performed by tunneling electrons between the channel and the charge storage layer of the selected memory cell. In this way, high integration and low power consumption are achieved in the flash memory.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 2A to FIG. 2D are schematic diagrams representing a structure of an AND-type memory cell array according to an embodiment of the disclosure.

FIG. 7A to 7C are diagrams illustrating an erase operation of the AND-type flash memory according to an embodiment of the disclosure.

DESCRIPTION OF THE EMBODIMENTS

The disclosure relates to a flash memory with a metal-oxide-nitride-oxide-Si (MONOS)-type or si-oxide-nitride-oxide-si (SONOS)-type AND-type memory cell array structure. High integration and low power consumption are achieved in the flash memory through the use of a structure in which the nitride film traps charges.

Figure 1:
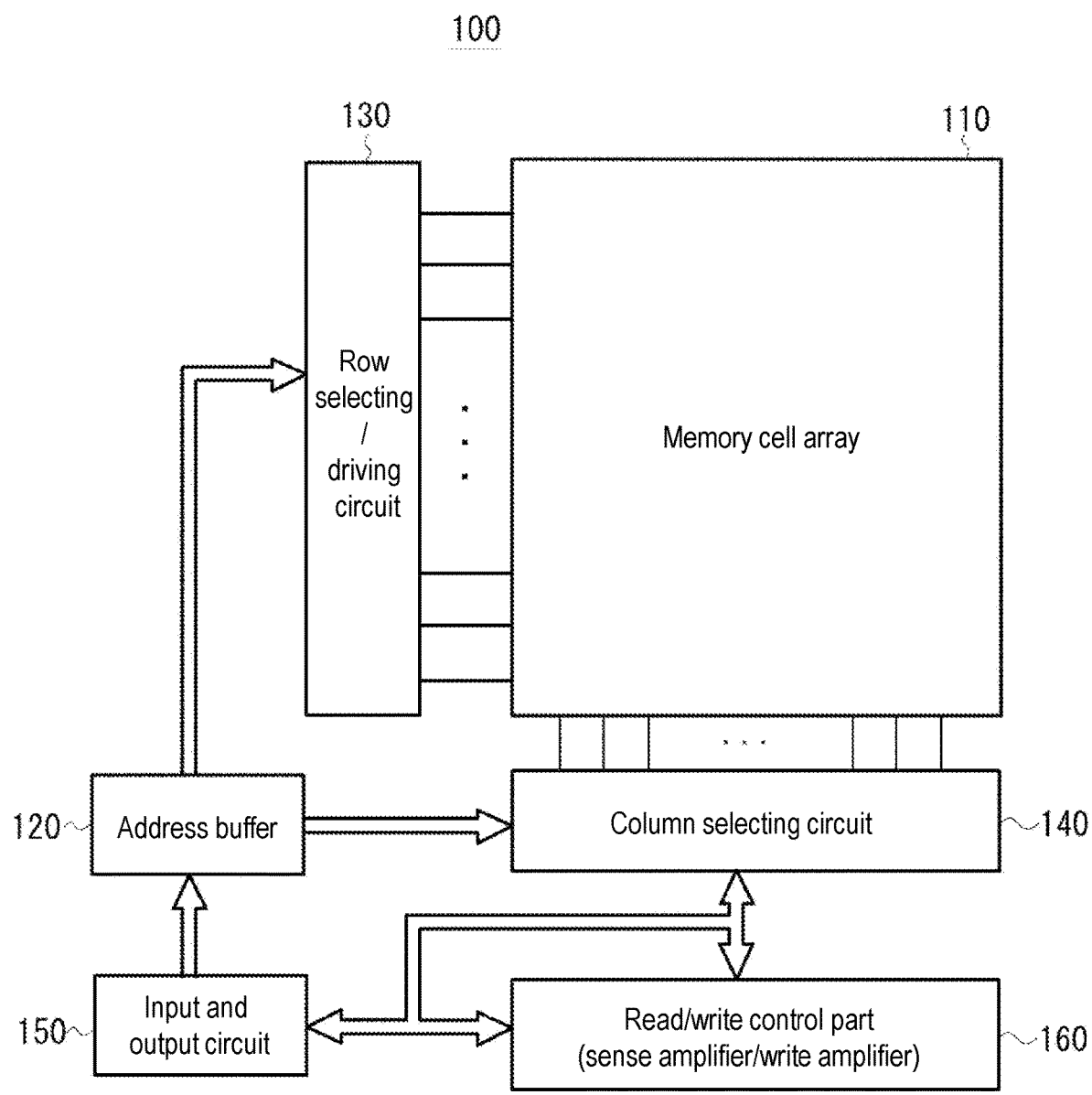
FIG. 1 is a block diagram representing a structure of a flash memory according to an embodiment of the disclosure.

Next, embodiments of the disclosure will be described in detail with reference to the accompanying drawings. FIG. 1 is a block diagram representing a main overall structure of a flash memory 100 of this embodiment. With reference to FIG. 1, the flash memory 100 includes a memory cell array 110, an address buffer 120, a row selecting/driving circuit 130, a column selecting circuit 140, an input and output circuit 150, and a read/write control part 160. The memory cell array 110 has an AND-type memory cell array structure. The address buffer 120 stores an externally-inputted address. The row selecting/driving circuit 130 selects a word line based on a row address and drives the selected word line. The column selecting circuit 140 selects a bit line or a source line based on a column address. The input and output circuit 150 sends and receives data or a command to and from an external host/device. The read/write control part 160 senses data read from a selected memory cell during a read operation, applies a bias voltage for writing into the selected memory cell to a bit line or the like during a programming operation, or applies an erase voltage to a P well and the like during an erase operation. These parts are connected by an internal busbar capable of sending and receiving addresses, data, control signals, and the like. In addition, although not shown herein, a voltage generating circuit for generating various bias voltages and the like are included.

FIG. 2A to FIG. 2D are diagrams illustrating an AND-type memory cell array. FIG. 2A is a plan view of the memory cell array, FIG. 2B is a cross-sectional view taken along a line Y1-Y1 in FIG. 2A, FIG. 2C is a cross-sectional view taken along a line Y2-Y2 in FIG. 2A, and FIG. 2D is a cross-sectional view taken along a line X-X in FIG. 2A. Parts A and B in FIG. 2C and FIG. 2D represent one memory cell MC, and FIGS. 3A and 3B are enlarged views of parts A and B.

Figure 3A:
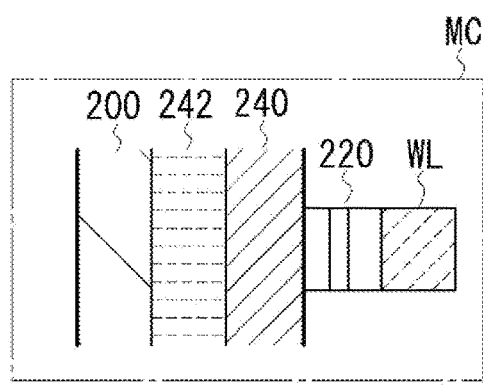
FIGS. 3A and 3B are enlarged views of parts A and B of a memory cell shown in FIG. 2A to FIG. 2D.
Figure 3B:
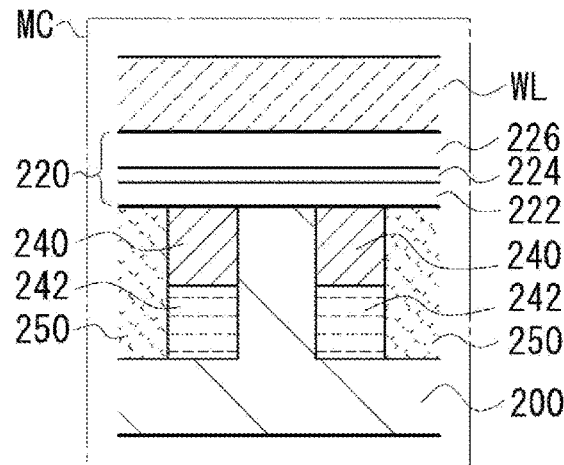

With reference to 2A to FIG. 2D and FIG. 3A to FIG. 3B, the memory cell array 110 is formed, for example, in a P-well region 200, and the P-well region 200 is formed in an N-type silicon substrate or an N-type silicon region. A plurality of word lines WL extending in a row direction (X direction) are formed in the P-well region 200, and a plurality of metal lines 210 are formed in a column direction (Y direction) to cross the word lines WL. The metal lines 210 may act as bit lines BL and source lines SL. The word lines WL are made of, for example, conductive polysilicon materials, and the metal lines 210 are made of, for example, metal materials such as Al, Cu, and W.

A charge storage layer 220 extending in the row direction is formed directly below the word lines WL. The charge storage layer 220 may store electrons injected through Fowler-Nordheim (FN) tunneling with the P-well region. In an embodiment, the charge storage layer 220 may include, for example, a silicon nitride film (SiN) for trapping electrons. In another embodiment, the charge storage layer 220 may have an ONO structure including a silicon oxide film 222, a silicon nitride film 224, and a silicon oxide film 226 as shown in FIG. 3A and FIG. 3B. The silicon oxide film 222 in the lower layer is thick enough to allow electrons to tunnel with a channel, and the silicon oxide film 226 in the upper layer is thick enough to provide an insulation and withstand voltage between the charge storage layer and the gate (word line). The silicon nitride film 224 traps electrons at an interface with the silicon oxide film 222. A film thickness of the entire ONO structure is, for example, approximately 50 angstroms.

Figure 4:
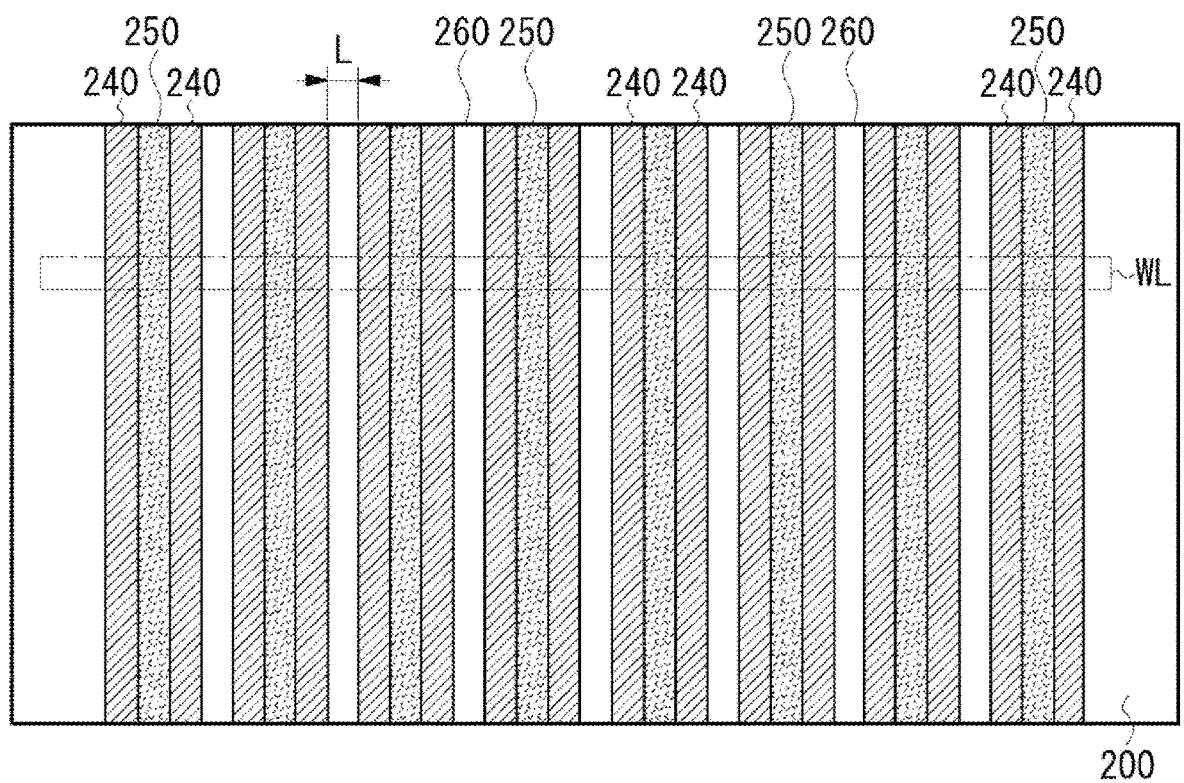
FIG. 4 is a schematic diagram representing a plan view of N+ diffusion regions and isolation regions of the memory cell array shown in FIG. 2A.

In the P-well region 200, as shown in FIG. 4, a plurality of N+-type diffusion regions 240 extending in the column direction (Y direction) are formed at regular intervals L. The diffusion regions 240 may act as the source regions and the drain regions the memory cells. An isolation region 250 is formed adjacent to one side of one diffusion region 240, and a channel 260 of the memory cell is formed on the other side. The isolation region 250 may be, for example, an oxidized region formed by a shallow trench (STI) or the like.

The plurality of word lines WL (note that only one word line WL is illustrated in FIG. 4) are formed through the charge storage layer 220 in the row direction crossing the plurality of diffusion regions 240. For instance, the ONO structure and the polysilicon layer may be laminated on the silicon substrate, and the polysilicon layer and the ONO structure may be patterned by photolithographic etching steps, and the charge storage layer 220 and the word line WL on it are thereby formed.

One memory cell MC is composed of a metal oxide semiconductor transistor including a source region, a drain region, the charge storage layer 220, and a gate. As shown in FIG. 3A and FIG. 3B of the memory cell MC, the word line WL constitutes the gate, and the adjacent diffusion region 240 constitutes the source region and the drain region. Therefore, each interval L in the row direction of the diffusion regions 240 defines a gate length of the transistor.

In this embodiment, the memory cell MC performs programming and erasing through FN tunneling between the channel and the charge storage layer 220, instead of generating a channel current between the source and the drain as in a NOR-type memory cell. In this way, the shrinkage of the gate length may not be restricted due to the problem of punch-through. Therefore, the gate length L between the diffusion regions 240 may be reduced to be less than the gate length L of the NOR-type memory cell.

Further, N-type channel blocking regions 242 may also be formed in a depth direction of the diffusion regions 240 for improving the withstand voltage. The diffusion regions 240 or the channel blocking regions 242 are formed, for example, by implanting ions.

As shown in FIG. 2A to FIG. 2D, the plurality of metal lines 210 extend in the column direction parallel to the plurality of diffusion regions 240 and are electrically connected to the diffusion regions 240 through contact points 270. Although not shown herein, an interlayer insulating film is formed between a surface of the silicon substrate and the metal lines 210, and the contact points 270 are connected to the diffusion regions 240 through via holes formed in the interlayer insulating film. The contact points 270 include conductive plugs and the like.

The contact points 270 are disposed at positions crossing a plurality of word lines in the column direction. In the example of FIG. 2A to FIG. 2D, the contact points 270 are provided at positions crossing three word lines WL. In other words, the diffusion region 240 provided to the drain regions of the three memory cells forms a local bit line LBL, and the diffusion region 240 provided to the source regions of the three memory cells forms a local source line LSL.

The number of memory cells connected to the local bit line LBL/local source line LSL together is not particularly limited, for example, 8 memory cells or 16 memory cells may be connected as 1 bundle together. In this case, the contact points 270 are provided at positions crossing 8 word lines WL in the row direction or at positions crossing 16 word lines WL. By arranging the local bit line LBL/local source line LSL, the number of contact points between the bit lines BL and the source lines SL and the diffusion regions 240 may be reduced. In this way, the high integration of the memory cell array or the miniaturization of a memory cell is achieved. In addition, by arranging the contact points 270 at regular intervals, the resistance generated by using the diffusion regions 240 may be reduced.

Figure 5A:
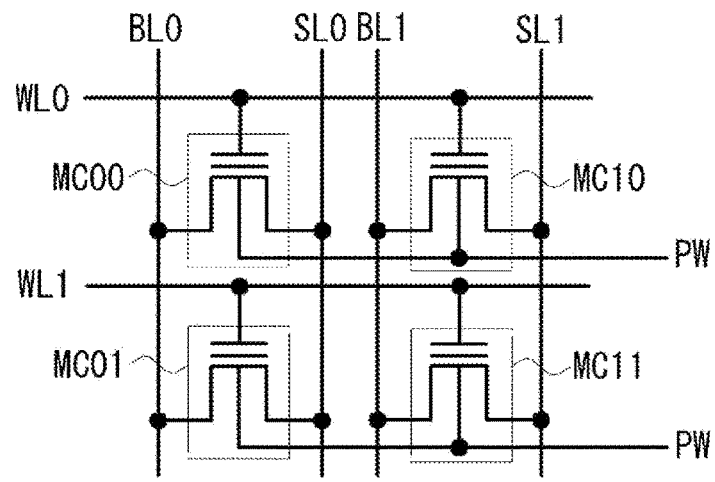
FIG. 5A is an equivalent circuit diagram of the AND-type memory cell array of this embodiment.

FIG. 5A is an equivalent circuit of the AND-type memory cell array of this embodiment, and four memory cells MC00, MC01, MC10, and MC11 are illustrated herein. The gates of the memory cells MC00 and MC10 in the row direction are connected to a corresponding word line WL0 together, and the gates of the memory cells MC01 and MC11 in the row direction are connected to a corresponding word line WL1 together. Further, the drain regions of the memory cells MC00 and MC01 in the column direction are connected to a corresponding bit line BL0 together, and the source regions are connected to a corresponding source line SL0 together. The drain regions of the memory cells MC10 and MC11 in the column direction are connected to a corresponding bit line BL1 together, and the source regions are connected to a corresponding source line SL1 together. As such, a well voltage PW is applied to the P well region where the memory cells MC00, MC10, MC01, and MC11 are formed.

The AND-type memory cell is different from the NOR-type memory cell. 1 group of bit lines and source lines is completely separated from the other groups of bit lines and source lines, and a plurality of memory cells are connected in parallel between the bit lines and the source lines.

Figure 5B:
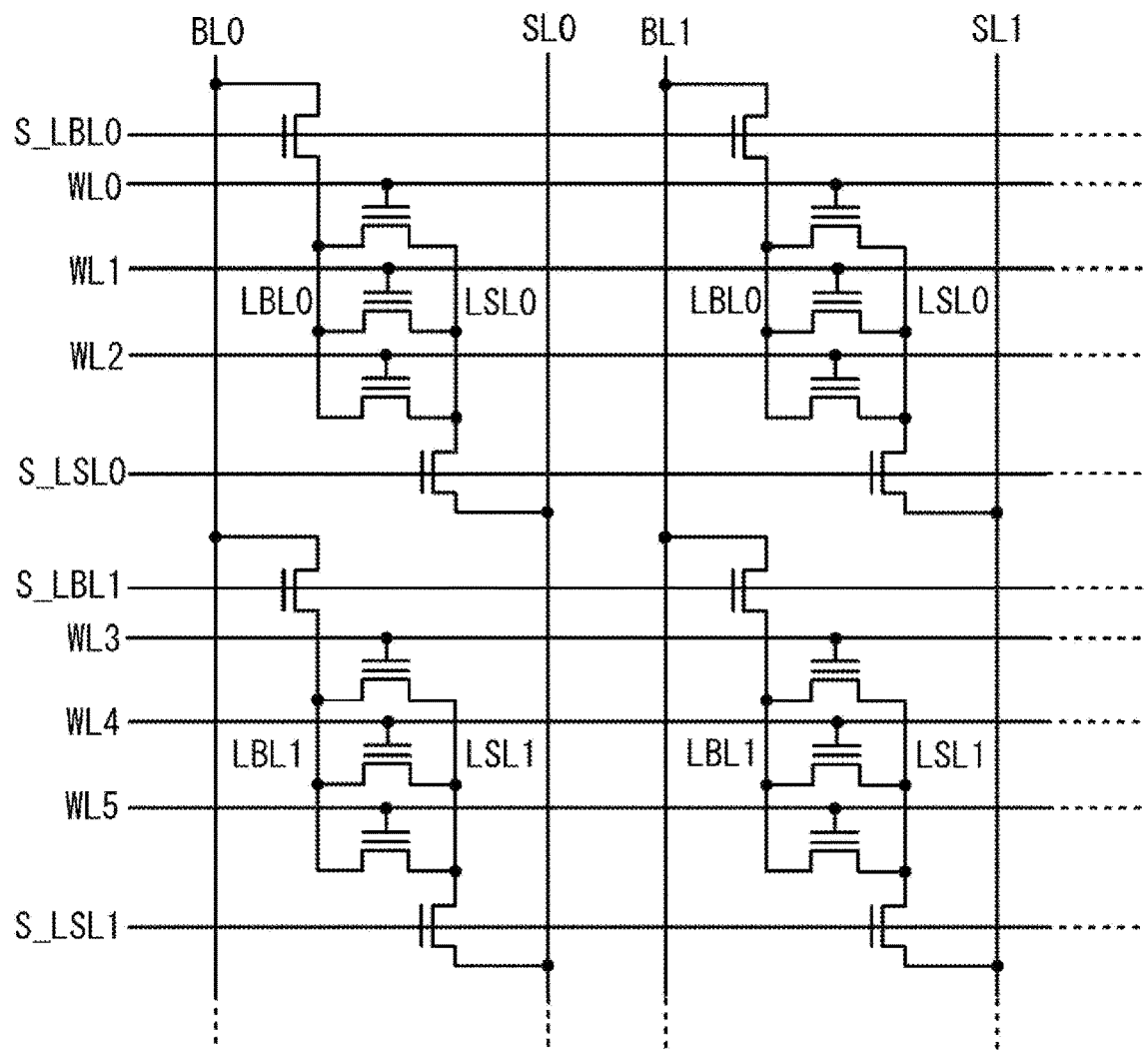
FIG. 5B is another equivalent circuit diagram of the AND-type memory cell array of this embodiment.

Further, FIG. 5B shows another equivalent circuit when the local bit line LBL/local source line LSL is formed by combining three word lines WL as 1 bundle as shown in FIG. 2A to FIG. 2D. The drain regions of the three memory cells connected to the word lines WL0, WL1, and WL2 are connected to the local bit line LBL together, and the source regions are connected to the local source line LSL together. A bit line side selection transistor is provided between the local bit line LBL and the bit line BL, and a source line side selection transistor is provided between the local source line SLS and the source line SL. A selection signal S_LBL is applied to the gate of the bit line side selection transistor, and a selection signal S_SLS is applied to the gate of the source line side selection transistor. For instance, when the word line WL1 is selected, a selection signal S_LBL0 and a selection signal S_LSL0 are driven to H level, a local bit line LBL0 is connected to the bit line BL0, and a local source line LSL0 is connected to the source line SL0.

In this way, a selected local bit line and a local source line among a plurality of local bit lines LBL and a plurality of local source lines LSL are selectively connected to the bit line BL and the source line SL. Therefore, the parasitic capacitance of the bit line BL and the source line SL is reduced, and power consumption is saved.

The row selecting/driving circuit 130 selects the word line WL based on the row address and drives the selected word line WL and an unselected word line with a voltage corresponding to the operation. For instance, during a read operation, a read voltage is applied to a selected word line. During a programing operation, a programming voltage is applied to a selected word line, and a programming prohibition voltage is applied to an unselected word line. During an erase operation, an erase voltage is applied to a selected word line, and an erase prohibition voltage is applied to an unselected word line. Further, when the bit line side selection transistor and the source line side selection transistor are arranged as shown in FIG. 5B, the corresponding selection signals S_LBL and S_SLS are driven to H level.

The column selecting circuit 140 selects the bit line BL and the source line SL based on the column address, and applies a voltage corresponding to the operation to the selected bit line BL and source line SL, or brings the unselected bit line or the unselected source line into a floating state.

The read/write control part 160 controls operations such as reading, programming, and erasing according to a command received from an external host device. The read/write control part 160 includes a sense amplifier, a write amplifier, and the like. The sense amplifier senses the current and voltage flowing through the bit line BL and the source line SL connected to the selected memory cell during the read operation. The write amplifier applies a read voltage to the selected bit line during the read operation, and applies a voltage to the selected bit line or the unselected bit line during the programming operation, or generates a well potential PW to be applied to a P well. Further, during the erase operation, the bit line or the source line is brought into a floating state to generate the well potential PW to be applied to the P well.

Next, the operation of the flash memory of this embodiment is described.

[Read Operation]

When receiving an external read command or address through the input and output circuit 150, the read/write control part 160 controls a sequence of a read operation based on the read command. The row selecting/driving circuit 130 selects a word line WL based on the row address provided by the address buffer 120 and applies a read voltage to the selected word line WL. The column selecting circuit 140 selects a bit line BL and a source line SL based on the column address provided by the address buffer 120.

The read/write control part 160 applies a positive voltage to the selected bit line BL, senses the voltage or current flowing through the selected source line SL, and determines and reads data "0" and "1". If the selected memory cell is not programmed (if it is in an erase state), the selected memory cell is turned on by the read voltage, the selected source line SL generates a voltage or current, and the data "1" is sensed. On the other hand, if the selected memory cell is programmed, the selected memory cell is not turned on by the read voltage, and the selected source line SL does not generate a voltage or current, so data "0" is sensed. The read/write control part 160 outputs the sensed data to the outside through the input and output circuit 150. Reading may be performed in units of pages similarly to a NAND flash memory and may also be performed in programming verification or erase verification to be described in the following paragraphs.

[Programming Operation]

When receiving an external programming command, address, and data through the input and output circuit 150, the read/write control part 160 controls a sequence of a programming operation based on the programming command. The row selecting/driving circuit 130 selects a word line WL based on the row address, applies a programming voltage to the selected word line WL, and applies a programming prohibition voltage to an unselected word line. The column selecting circuit 140 selects a bit line BL and a source line SL based on the column address.

Figure 6A:
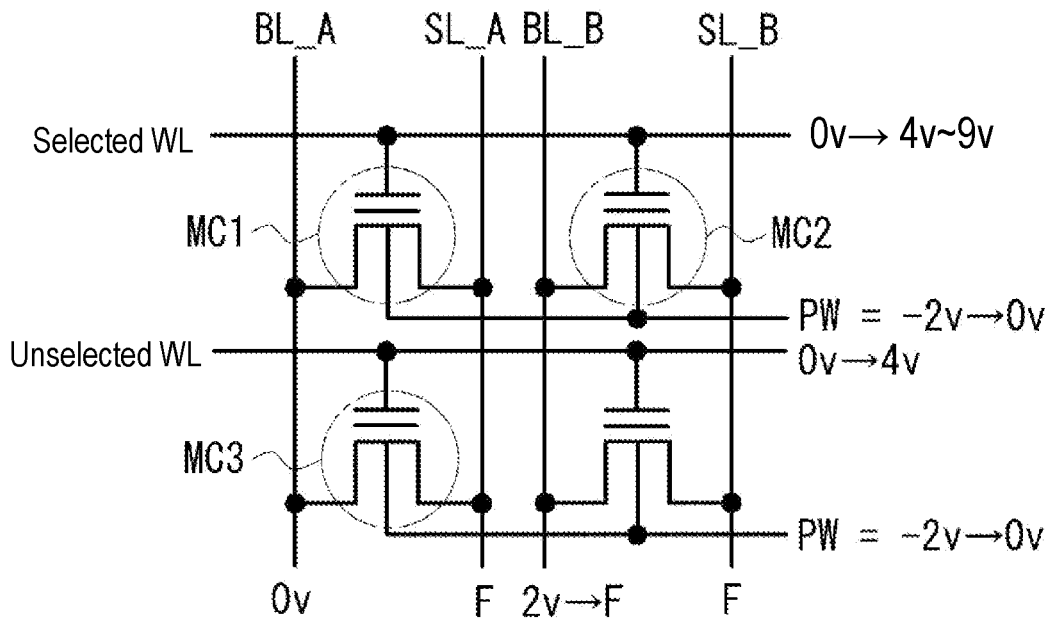
FIG. 6A and FIG. 6B are diagrams illustrating a programming operation of an AND-type flash memory according to an embodiment of the disclosure.
Figure 6B:
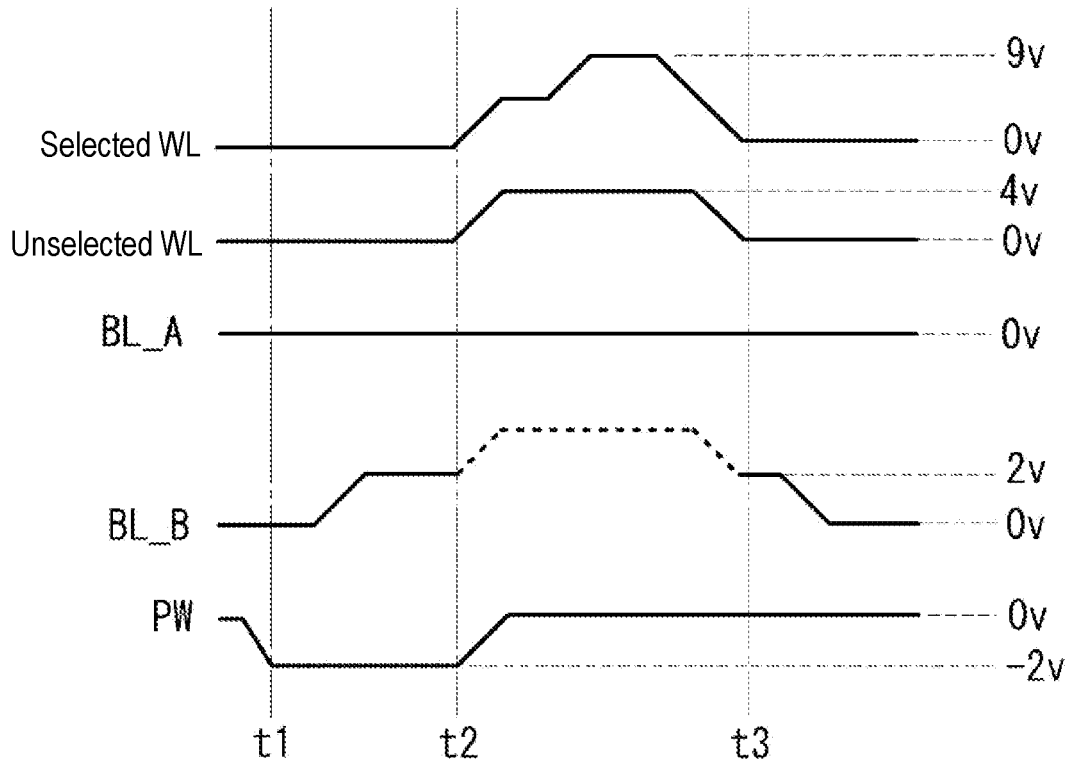

An example of a bias voltage applied to each part during the programming operation is shown in FIG. 6A and FIG. 6B. Herein, it is assumed that the selected memory cell MC1 is programmed. Time t1 to t2 is a precharging period for the unselected bit line, and during this period, a positive precharging voltage (e.g., 2v) is applied to an unselected bit lines BL_B. On the other hand, 0 v is applied to a selected bit line BL_A, and the selected word line WL and the unselected word line WL are 0 v. A selected source line SL_A and an unselected source line SL_B are in a floating state. Further, a negative voltage of −2 v is applied to the P well as a substrate potential PW. The precharging voltage of the unselected bit line BL_B is applied while a negative voltage is applied to the P well.

If the precharging period ends at time t2, the selected memory cell MC1 is programmed at time t2 to t3. A programming voltage (e.g., 4 v to 9 v) is applied to the selected word line WL in two stages, a programming prohibition voltage (e.g., 4 v) is applied to the unselected word line WL, and 0 v, for example, is applied to the P well, so that the unselected bit line BL_B is floated. When the P well transitions from a negative voltage to 0 v, the precharging voltage of the unselected bit line BL_B is boosted. Therefore, when the programming prohibition voltage is applied to the unselected word line WL, the boosted precharging voltage of the unselected bit line BL_B is further boosted through the capacitive coupling between the drain region and the gate.

After the voltage of the unselected bit line BL_B (drain region) is boosted, a programming voltage of 9 v boosted from 4 v is applied to the selected word line WL. When the selected memory cell MC1 is turned on, 0 v is applied to the selected bit line BL_A, so the channel potential becomes 0 v. The potential difference between the channel and the gate is large enough to allow electrons to tunnel from the channel FN into the charge storage layer 220, and the tunneled electrons are captured by the nitride film of the charge storage layer 220, so that data "0" is programmed.

On the other hand, an unselected memory cell MC2 is turned on due to the application of 9 v to the selected word line WL. The precharging voltage of the unselected bit line BL_B is boosted by the well potential PW of the P well as described above and further self-boosted by the capacitive coupling between the drain region and the gate. The voltages of the channel and source region of the unselected memory cell MC2 rise similarly to the drain region. The potential difference between the channel and the gate of the selected memory cell MC2 is not large enough to allow electrons to tunnel from the channel FN to the charge storage layer 220, so programming of the unselected memory cell MC2 is prohibited.

An unselected memory cell MC3 is turned on due to the application of the programming prohibition voltage (4 v) to the unselected word line WL, and the channel potential becomes 0 v. However, the potential difference between the channel and the gate of the unselected memory cell MC3 is less than the potential difference between the channel and the gate of the selected memory cell MC1, and the potential difference is not large enough for electrons to perform FN tunneling. Therefore, programming of the unselected memory cell MC3 is prohibited.

Programming of the selected memory cell may be performed by incremental step pulse programming (ISPP) similarly to NAND-type flash memory. In the case of programming verification failure, a programming voltage higher than the step voltage is applied to the selected word line of the selected memory cell. Like NAND flash memory, programming may be performed in units of pages or simultaneously for a plurality of memory cells.

[Erase Operation]

For instance, when receiving an external erase command or address through the input and output circuit 150, the read/write control part 160 controls a sequence of an erase operation based on the erase command. Erasure may be performed in units of word lines.

FIG. 7A represents an example of a bias voltage applied to each part of a selected word line to be erased. FIG. 7B represents an example of a bias voltage applied to each part of an unselected word line for which erasing is prohibited. FIG. 7C is a sequence diagram of applied bias voltages. FIG. 7A to FIG. 7C above represent an example in which the selected memory cell connected to two selected word lines WL is erased, and the dotted line of the source line SL represents the potential of the floating state.

At time t1, the row selecting/driving circuit 130 selects a word line WL based on the row address and applies 0 v to an unselected word line WL. The read/write control part 160 puts all the bit lines BL and source lines in a floating state and applies 0 v as the well potential PW to the P well.

At time t2, an erase prohibition voltage (e.g., 3 v) is applied to the unselected word line WL. Since the bit line BL and the source line SL are in a floating state, the potentials of the source region and the channel are slightly raised by self-boosting.

Next, at time t3, a voltage (e.g., 5 v) slightly higher than the erase prohibition voltage is applied to the P well. By applying a slightly higher positive voltage to the P well, the electron holes are concentrated near the channel (electrons are removed). The period in which a positive voltage is applied to the P well is, for example, several tens of μs, and this period is a period in which erasure prohibition is set for the unselected memory cell of the unselected word line before erasing.

Next, from time t4 to time t5, a negative erase voltage (e.g., −5 v) is applied to the selected word line WL. In this case, the potential difference between the gate and the channel of the selected memory cell is large enough to release electrons stored in the charge storage layer 220 into the channel through FN tunneling. The electrons released from the charge storage layer 220 into the channel recombine with the electron holes gathered near the channel and annihilate. In this way, the data of the selected memory cell of the selected word line WL is erased.

On the other hand, the potential difference between the gate (3 v herein) and the channel (5 v herein) of the unselected memory cell of the unselected word line is not large enough to allow the electrons stored in the charge storage layer 220 to perform FN tunneling. Therefore, the electrons stored in the charge storage layer 220 are not released into the channel, so that erasure of the unselected word line is prohibited. 0 v is then applied to the P well at time t6, and 0 v is applied to the unselected word line WL at time t7, and the erase sequence ends.

Erasure may also be performed in units of word lines, but it is preferable to perform one-time erasure in a magnetic region unit including a plurality of word lines. In this case, magnetic regions are connected through a magnetic region selection transistor, and the magnetic region of an object to be erased is selected by the magnetic region selection transistor. Interference between the selected word line and the unselected word line is thereby avoided.

As described above, according to this embodiment, the memory cell array is configured as an AND structure, and FN tunneling is used to program and erase the memory cells, so that high integration and low power consumption of the flash memory may be achieved.

In the embodiments, the local bit line LBL or the local source line LSL is formed by the diffusion regions, but it is not limited thereto, and the local bit line LBL or the local source line LSL may also be formed by a multilayer wiring structure. That is, the local bit line and the local source line are constituted by a wiring layer formed between the bit line and the source line and the diffusion regions.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A operating method of a flash memory, wherein the flash memory comprises a memory cell array, the memory cell array comprises:
a plurality of word lines extending in a row direction, a plurality of bit lines extending in a column direction, a plurality of source lines, and a plurality of memory cells, wherein each of the memory cells comprises a charge storage layer, a gate formed on the charge storage layer, and a drain region and a source region connected to the bit line and the source line, the plurality of memory cells are connected in parallel between the bit lines and the source lines, and the gates of the memory cells in the row direction are connected to the corresponding word lines together, wherein the operating method comprises:

selecting among the word lines in the row direction;

selecting among the bit lines and the source lines in the column direction; and controlling the reading, programming, or erasing of the selected memory cell, wherein the programming or erasing is performed by tunneling of electrons between a channel and the charge storage layer of the selected memory cell, wherein the operating method further comprises:

applying a negative erase voltage to one or more selected word lines and applying a positive voltage to a P well, so that the electrons are released from the charge storage layer of the selected memory cell of each selected word line to the channel; and applying a positive erase prohibition voltage to the unselected word line and applying the positive voltage for a fixed period to the P well before applying the erase voltage to the selected word line.

2. The operating method according to claim 1, wherein the charge storage layer is an ONO structure comprising a nitride film and oxide films located above and below the nitride film.

3. The operating method according to claim 1, wherein the memory cell array further comprises a P well, in the P well, a plurality of diffusion regions of N-type are formed at regular interval in the column direction, the plurality of diffusion regions provide the source regions and the drain regions of the memory cells, and each regular interval defines a gate length of each memory cell.

4. The operating method according to claim 3, wherein the plurality of word lines extend in the row direction on the plurality of diffusion regions through the charge storage layer, the plurality of bit lines and the plurality of source lines extend in the column direction on the plurality of word lines through an interlayer insulating film, the channel of the memory cell is formed on one adjacent side of the plurality of diffusion regions, and an insulating region is formed on another adjacent side opposite to the one adjacent side.

5. The operating method according to claim 4, wherein the plurality of bit lines and the plurality of source lines are electrically connected to the corresponding diffusion regions through contact points formed at positions crossing the plurality of word lines.

6. The operating method according to claim 1, wherein the memory cells are connected in parallel between a local bit line and a local source line, the local bit line is connected to the bit lines through a first selection transistor, the local source line is connected to the source lines through a second selection transistor, wherein the operating method further comprises:

selecting the local bit line through the first selection transistor and selecting the local source line through the second selection transistor.

7. The operating method according to claim 1, further comprising:

applying a programming voltage to the selected word line and applying a programming prohibition voltage less than the programming voltage to an unselected word line, so that the electrons tunnel from the channel of the selected memory cell of the selected word line to the charge storage layer.

8. The operating method according to claim 7, further comprising:

applying a precharging voltage to an unselected bit line connected to an unselected memory cell before applying the programming prohibition voltage to the unselected word line.

9. The operating method according to claim 8, further comprising:

wherein during a period when a negative voltage is applied to a P well, applying the precharging voltage to the unselected bit line to float the unselected bit line and then shifting a voltage of the P well to a positive direction before applying the programming prohibition voltage to the unselected word line, so the precharging voltage is boosted.

10. The operating method according to claim 9, further comprising:

applying the programming prohibition voltage to the unselected word line to further boost the boosted precharging voltage.

11. The operating method according to claim 10, further comprising:

applying a first programming voltage and a second programming voltage higher than the first programming voltage to the selected word line in two stages, wherein the second programming voltage is applied after the programming prohibition voltage is boosted.

12. The operating method according to claim 1, further comprising:

applying the erase prohibition voltage to an unselected word line to prohibit the erasure of an unselected memory cell of the unselected word line.

13. The operating method according to claim 1, wherein the selected memory cell is programmed in units of word lines.

14. The operating method according to claim 1, wherein the selected memory cell is erased in units of word lines.

* * * * *